United States Patent
Tsuchimoto et al.

(10) Patent No.: US 6,358,313 B1
(45) Date of Patent: Mar. 19, 2002

(54) METHOD OF MANUFACTURING A CRYSTALLINE SILICON BASE SEMICONDUCTOR THIN FILM

(75) Inventors: Shuhei Tsuchimoto; Hirohisa Tanaka, both of Nara; Kiyoshi Ogata, Yawata; Hiroya Kirimura, Kyoto, all of (JP)

(73) Assignees: Sharp Kabushiki Kaisha, Osaka; Nissin Electric Co., Ltd., Kyoto, both of (JP)

( * ) Notice: Subject to any disclaimer, the term of this patent is extended or adjusted under 35 U.S.C. 154(b) by 0 days.

(21) Appl. No.: 09/469,326

(22) Filed: Dec. 22, 1999

(30) Foreign Application Priority Data

Dec. 22, 1998 (JP) .......................................... 10-364263

(51) Int. Cl.⁷ .............................................. C30B 29/06
(52) U.S. Cl. .................... 117/8; 117/9; 117/85; 117/95; 117/96; 117/105; 117/930
(58) Field of Search .......................... 117/930, 95, 96, 117/105, 85, 8, 9

(56) References Cited

U.S. PATENT DOCUMENTS 5,122,482 A * 6/1992 Hayashi et al. .............. 437/225
5,484,746 A * 1/1996 Ichikawa et al. ............. 437/83
5,495,824 A * 3/1996 Yonehara et al. ............... 117/8
5,843,225 A * 12/1998 Takayama et al. ............. 117/8

OTHER PUBLICATIONS

Yin et al., "A comprehensive study of plasma enhanced crystallization of a–Si:H films on glass" MAter. Res. Soc. Symp. Proc, vol. 345, pp 81–6 abs only, 1994.*

* cited by examiner

Primary Examiner—Robert Kunemund
(74) Attorney, Agent, or Firm—Arent Fox Kintner Plotkin & Kahn, PLLC

(57) ABSTRACT

A method of manufacturing a crystalline silicon base semiconductor thin film on a substrate, includes the steps of forming a thin film primarily made of silicon on the substrate by forming plasma of a film material gas containing at least a silicon base gas at the vicinity of the substrate; and crystallizing the silicon in the thin film primarily made of the silicon by emitting excited particles produced from an excited particle material gas to the substrate. At least one of the film material gas and the excited particle material gas contains an impurity gas for forming the silicon semiconductor, and thereby the crystalline silicon base semiconductor thin film is formed on the substrate.

16 Claims, 1 Drawing Sheet

METHOD OF MANUFACTURING A CRYSTALLINE SILICON BASE SEMICONDUCTOR THIN FILM

The invention is based on patent application No. 10-364263 Pat. filed in Japan, the contents of which are hereby incorporated by reference.

BACKGROUND OF THE INVENTION

1. Field of the Invention

The present invention relates to a method of manufacturing a crystalline silicon base semiconductor thin film containing impurity required for formation of silicon semiconductors such as n- and p-type silicon semiconductors, which can be a material of silicon base transistors such as a c-MOS transistor used in integrated circuits such as a Large Scale Integrated Circuit (LSI).

2. Description of the Background Art

A method of manufacturing a crystalline silicon base semiconductor thin film in the prior art primarily requires three different steps. In a first step, an amorphous silicon thin film or a silicon thin film containing fine crystals is formed on a substrate, e.g., by a vapor phase composition method such as a thermal CVD method or a plasma CVD method. In a second step, the silicon thin film is subjected to recrystallization by a laser annealing method or a solid phase growth method, in which thermal processing is performed by a thermal processing furnace, a high-temperature lamp or the like. In a third step, impurity doping is performed by implanting impurity, which is required for formation of n- or p-type silicon semiconductor, into the crystalline silicon thin film formed in the second step, e.g., by an ion implanting method. Depending on the structure of the transistor, the third step may be performed before the second step.

As described above, the conventional method roughly requires the three steps, each of which requires a very expensive apparatus, resulting in increase in prices of final products. Accordingly, a manufacturing method, which requires a minimum number of steps, has been desired for producing inexpensive products.

Further, the foregoing conventional method suffers from the following problems.

In a process of producing a crystalline silicon thin film which will form, e.g., a base of a transistor, a substrate is heated to about 600° C. when the solid phase growth method is performed as thermal treatment for recrystallizing the amorphous silicon thin film. In view of a resistance against thermal damages, therefore, a material of the substrate can be selected only from a restricted range, and the usable substrate material is restricted. In the laser annealing method, since adhesion between the substrate and the amorphous silicon thin film prepared by the vapor phase composition is low, the film is liable to be peeled off from the substrate when it is irradiated with laser beams, and further the particle diameters of crystals cannot be sufficiently controlled.

In the third step for doping the crystallized silicon thin film with impurity, e.g., by ion implanting method, a large number of lattice defects may occur in the film during ion implantation. Further, the crystals may be destroyed so that an amorphous layer may be formed.

Accordingly, it has been desired to provide a method, which can be used instead of the foregoing conventional manufacturing method, and can produce a semiconductor thin film having a good crystallinity and therefore a good quality at a low temperature.

As sizes of devices in Large Scale Integrated Circuits (LSIs) have been reduced in recent years, it becomes important to from an extremely shallow diffusion layer of impurity for semiconductor formation. Thus, reduction in size of the transistors has been required in accordance with miniaturization of devices in the LSI, and therefore it becomes important to determine a manner for adding impurity such as donor and acceptor forming the p- and n-type semiconductors into fine regions. For this impurity addition, a conventional ion implanting method has been improved to perform ion implantation with a low energy of 40 keV or less. However, it is impossible in the ion implanting method to prevent such a phenomenon (channeling effect) that the ions implanted into crystalline silicon move deeply through gaps between atoms of the crystals with a certain probability. When they move deeply, the impurity distribution exhibits a deep form having a long tail. Further, the ion implantation requires subsequent thermal treatment for activating the implanted impurity. During this thermal treatment, the impurity diffuses extremely fast in the tail portion of the impurity distribution due to reaction between the impurity and the defects which occurred during the ion implantation. Due to this, it is very difficult to form an extremely shallow diffusion layer having a high impurity concentration.

SUMMARY OF THE INVENTION

Accordingly, it is an object of the invention to provide a method, in which a crystalline silicon base semiconductor thin film can be manufactured inexpensively with a reduced energy, compared with the conventional method employing the three steps.

Also, an object of the invention is to provide a method, in which a crystalline silicon base semiconductor thin film having a good crystallinity and therefore a good quality can be manufactured at a low temperature.

Further, an object of the invention is to provide a method of manufacturing a crystalline silicon base semiconductor thin film, in which control can be performed to achieve a desired state of distribution, in a film thickness direction, of impurity required for silicon semiconductor formation.

The desired state of distribution is selected from a state in which the distribution is uniform in the film thickness direction, a state in which a distribution in an intended concentration is achieved at an intended portion in the film thickness direction and other states.

Further, an object of the invention is to provide a method of manufacturing a crystalline silicon base semiconductor thin film, in which the crystalline silicon base semiconductor thin film can be produced on a substrate together with an oxide thin film and/or a metal thin film layered thereto while suppressing external application of impurity onto a film boundary.

The invention provides a method of manufacturing a crystalline silicon base semiconductor thin film on a substrate, including the steps of:

forming a thin film primarily made of silicon on the substrate by forming plasma of a film material gas containing at least a silicon base gas at the vicinity of the substrate; and crystallizing the silicon in the thin film primarily made of the silicon by emitting excited particles produced from an excited particle material gas to the substrate, wherein at least one of the film material gas and the excited particle material gas contains an impurity gas for forming the silicon semiconductor, and thereby the crystalline silicon base semiconductor thin film is formed on the substrate.

According to the method of the invention, formation of the crystalline silicon thin film and addition of impurity which is required for formation of the silicon semiconductor in the thin film can be performed simultaneously by one device. Therefore, the crystalline silicon base semiconductor thin film can be manufactured inexpensively with a small energy, compared with the conventional method of manufacturing the crystalline silicon base semiconductor thin film employing the foregoing three steps.

Further, the crystalline silicon base semiconductor thin film having a good crystallinity and therefore a good quality can be manufactured at a low temperature.

In order to achieve the desired state (particularly, the positions and concentrations) of distribution of the impurity in the film thickness direction required for formation of the silicon semiconductor, within a predetermined time band during formation of the thin film primarily made of silicon, the amount(s) of the impurity gas(es) in the film material gas and/or the excited particle material gas may be controlled to take on predetermined value(s), respectively. In the case where the excited particle material gas contains the impurity gas (including the case where the excited particle material gas itself is the impurity gas), control may be performed in a time band during formation of the thin film primarily made of silicon, e.g., by emitting excited particles produced from the excited particle material gas to the substrate so as to achieve the desired state (particularly, the positions and concentrations) of distribution of the impurity in the film thickness direction required for formation of the silicon semiconductor.

The invention can also provide a substrate carrying a crystalline silicon base semiconductor thin film of a good quality together with an oxide thin film and/or a metal thin film, and prepared by successively forming, under predetermined gas pressures, the oxide thin film and/or the metal thin film as well as the crystalline silicon base semiconductor thin film in a layered fashion while suppressing external application of impurity onto a film boundary.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
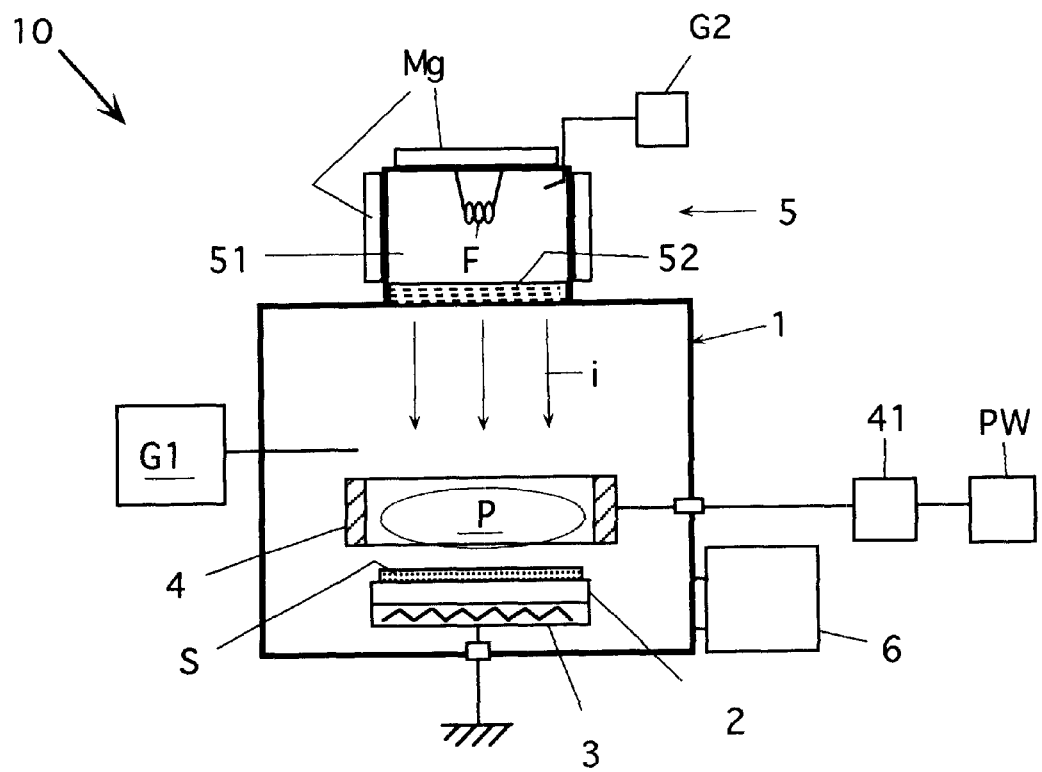
FIG. 1 shows an example of a schematic structure of a film forming device used for implementing a method of the invention.

According to a method of manufacturing a crystalline silicon base semiconductor thin film of an embodiment of the invention, plasma of a film material gas containing at least a silicon base gas is formed at the vicinity of a substrate, and thereby a thin film primarily made of silicon is formed on the substrate. Excited particles produced from an excited particle material gas are emitted to the substrate to crystallize silicon in the thin film primarily made of the silicon. At least one of the film material gas and the excited particle material gas is configured to contain an impurity gas for forming the silicon semiconductor, and thereby the crystalline silicon base semiconductor thin film is formed on the substrate.

The emission of the excited particles may be performed simultaneously with formation of the silicon-based thin film (i.e., the thin film primarily made of silicon), and more specifically the emission of the excited particles and the formation of the silicon-based thin film may be performed simultaneously and continuously. Alternatively, the emission of the excited particles and the formation of the silicon-based thin film may be performed alternately to each other.

The impurity gas may be contained in both the film material gas and the excited particle material gas. By addition of the impurity gas into the film material gas, the silicon-based thin film can contain the impurity. In this case, the excited particle material gas not containing the impurity gas may be used as the excited particle material gas dedicated to the crystallization of silicon, and may be, for example, one or more selected from a group including a silicon base gas which is the same as the base of the film material gas, a hydrogen gas and an inert gas (helium gas, neon gas, argon gas, krypton gas, xenon gas or the like). In this case, the silicon thin film produced from the plasma of the film material gas contains the impurity, and the silicon in the film is crystallized by irradiation with the excited particles.

Alternatively, the impurity gas may be contained in the excited particle material gas, and the silicon-based thin film produced from the film material gas may be a silicon thin film. In this case, the silicon in the film is crystallized by irradiation with the excited particles, and the impurity is implanted into the film. In this case, the excited particle material gas may be the impurity gas itself, or may be a mixture of the impurity gas and other gas(es). The other gas(es) may be one or more of a silicon base gas (particularly, a silicon base gas forming the film material gas), a hydrogen gas and an inert gas. The hydrogen gas and the inert gas may be used as a gas for diluting the impurity gas.

In the manufacturing of the crystalline silicon base semiconductor thin film, the following manner may be employed for controlling the state of distribution (particularly, the positions and concentration) of the impurity in the direction of the film thickness of the crystalline silicon base semiconductor thin film.

(1) In the case where the film material gas contains the impurity gas, control is performed such that the amount of impurity gas in the material gas takes on the predetermined value within a predetermined time band during formation of the silicon-based thin film.

(2) In the case where the impurity gas is contained in the excited particle material gas, and particularly, the excited particle material gas is a mixture of the impurity gas and the other gas, control is performed such that the amount of the impurity gas in the excited particle material gas takes on the predetermined value within a predetermined time band during formation of the silicon-based thin film.

(3) In the case where the excited particle material gas is the impurity gas or a gas mixture of the impurity gas and the other gas, excited particles produced from the excited particle material gas are emitted to the substrate within a predetermined time band during formation of the silicon-based thin film. This emission of the excited particles may be performed simultaneously with or alternately to the formation of the silicon-based thin film.

The silicon base gas forming the film material gas may be a silicon hydride gas such as a mono-silane ($SiH_4$) gas or a disilane ($Si_2H_6$) gas, a silicon fluoride gas such as a silicon tetrafluoride ($SiF_4$) gas, or a silicon chloride gas such as a silicon tetrachloride gas ($SiCl_4$), although not restricted thereto.

The foregoing silicon base gas may be solely used as the film material gas, or may be diluted with a dilution gas (e.g., a hydrogen gas) other than the silicon base gas for using the diluted gas as the film material gas. The silicon base gas may be mixed with the impurity gas as already described. The impurity gas may be typically a p-type impurity gas for obtaining a p-type silicon semiconductor, or an n-type impurity gas for obtaining an n-type silicon semiconductor.

The p-type impurity gas may be a boron base gas such as diborane, and the n-type impurity gas may be a phosphorus base gas such as phosphine.

A motion energy of the excited particles, which are emitted for formation of the crystalline silicon base semiconductor thin film, is preferably in a range from 10 eV to 20 keV, and more preferably in a range from 100 eV to 10 keV. If it were smaller than 10 eV, it would be difficult to emit a sufficient amount of excited particles, and it would be difficult to promote the reaction for growth of the silicon crystals even if the emission of the excited particles could be performed. If it were larger than 20 keV, irradiation with the excited particles would be liable to cause defects within the film, and the final device performance would be impaired.

For crystallization of the silicon, the appropriate amount (or number) of the excited particles, which are emitted during formation of the crystalline silicon base semiconductor thin film, may be preferably in a range from 0.1% to 50% of the amount (or number) of the silicon atoms deposited on the substrate, and more preferably in a range from 5% to 30%. If it were smaller than 0.1%, the reaction energy required for crystal growth would be small, and promotion of the crystal growth would be difficult. If the amount were larger than 50%, growth of defects would be promoted, and crystal growth would be impeded.

As already described, the oxide thin film and/or the metal thin film as well as the crystalline silicon base semiconductor thin film may be layered on the substrate under a predetermined gas pressure for providing the substrate carrying the crystalline silicon base semiconductor thin film together with the oxide thin film and/or metal thin film. The following methods may be employed as examples of the method of manufacturing the crystalline silicon base semiconductor thin film.

(1) Prior to formation of the silicon-based thin film, the oxide thin film is formed on the substrate, the crystalline silicon base semiconductor thin film is formed on the oxide thin film by any one of the foregoing methods, and the oxide thin film and the crystalline silicon base semiconductor thin film are successively formed under predetermined gas pressures, respectively.

(2) Prior to formation of the silicon-based thin film, the metal thin film is formed on the substrate, the crystalline silicon base semiconductor thin film is formed on the metal thin film by any one of the foregoing methods, and the metal thin film and the crystalline silicon base semiconductor thin film are successively formed under predetermined gas pressures, respectively.

(3) The crystalline silicon base semiconductor thin film is formed on the substrate by any one of the foregoing methods, the oxide thin film or the metal thin film is formed on the semiconductor thin film, and the semiconductor thin film as well as the oxide or metal thin film are successively formed under predetermined gas pressures, respectively.

The oxide thin film can be utilized, e.g., as a gate insulating film, and may be made of, e.g., silicon oxide ($SiO_2$) although not restricted thereto. The metal thin film can be utilized as a gate electrode, and may be made of, e.g., aluminum, chrome or nickel. In the case where these films are layered together with the crystalline silicon base semiconductor thin film, it is necessary to eliminate or minimize the impurity which may be externally applied to a boundary between the crystalline silicon base semiconductor thin film and the oxide or metal thin film for forming the crystalline silicon base semiconductor thin film of a good quality, or for minimizing a leak current when used as a device. In view of the above, it is preferable that the oxide and/or metal thin films and the crystalline silicon base semiconductor thin film are successively formed under the predetermined gas pressures without being exposed to an atmosphere, respectively.

In any one of the methods of forming the crystalline silicon base semiconductor thin film, it is preferable that the substrate is kept at a low temperature not exceeding, e.g., 550° C. for the purposes of preventing diffusion and local deposition of the impurity in a position other than the defined position during the film formation, and further for preventing the impurity, which is contained in the crystalline silicon base semiconductor thin film, or is present in the impurity diffusion layer to be formed at a predetermined concentration in the predetermined position in the film thickness direction, from being diffused or locally deposited in a position other than the defined position.

According to the method of manufacturing the crystalline silicon base semiconductor thin film described above, it is possible to manufacture the crystalline silicon base semiconductor thin film with a low cost and a small energy, compared with the conventional method employing the three steps.

Further, the crystalline silicon base semiconductor thin film having a good crystallinity and a good quality can be manufactured at a low temperature.

In particular, the crystalline silicon base semiconductor thin film can be obtained without using a conventional laser annealing step or thermal processing step such as a hot annealing step, and the semiconductor film is directly formed on the substrate according to the invention. Therefore, it is easy to provide the silicon having uniform crystal particle diameters, which enable provision of the device having stable characteristics. Further, the substrate having a low thermal resistance can be employed so that the substrate material can be selected from a wide range.

The distribution in the film thickness direction of the impurity required for forming the silicon semiconductor can be controlled to attain a desired state in the method of manufacturing the crystalline silicon base semiconductor thin film. This allows provision of extremely miniaturized transistor structures for high integration of LSIs in the future, resulting in remarkable advances in industry and technology.

The crystalline silicon base semiconductor thin film can be formed on the substrate together with the oxide and/or metal thin film(s) in a layered fashion while suppressing presence of externally applied impurity on the film boundary. This allows growth of the silicon crystals of a good quality, and it can be expected that the device employing the above substrate carrying the films has improved characteristics.

It is possible to provide the substrate, on which the oxide and/or metal thin film(s) and the crystalline silicon base semiconductor thin film are layered. Accordingly, by manufacturing the layered structure film on a glass substrate, it is advantageously possible to manufacture a system-on-panel which is internally and collectively provided with a driver LSI, a microprocessor and a memory.

Examples of a method of manufacturing a crystalline silicon base semiconductor thin film will now be described with reference to the drawings.

FIG. 1 shows a schematic structure of an example of a film forming device for implementing the film manufacturing method.

The film forming device 10 shown in FIG. 1 includes a vacuum chamber 1, a substrate holder 2 arranged in the chamber 1, a heater 3 arranged under the holder 2 for heating a substrate, a cylindrical discharging electrode 4 arranged above the holder 2 and opposed to the periphery of the substrate holder 2, and an excited particle generating source (ion source in this embodiment) 5 opposed to the substrate holder 2 through an inner space of the electrode 4.

The vacuum chamber 1 is connected to the exhaust device 6, and is also connected to a film material gas supply device G1 including one or more mass-flow controllers, valves, gas sources and others.

The discharging electrode 4 is connected to a high-frequency power source PW via a matching box 41.

The substrate holder 2 is grounded.

In the example shown in FIG. 1, the ion source 5 is connected to the chamber 1, and is arranged outside the chamber 1. However, the ion source 5 may be arranged inside the vacuum chamber 1.

The ion source 5 in this embodiment is of a bucket type, and includes an excited particle producing chamber (ion producing chamber in this embodiment) 51, which is connected to an excited particle material gas supply device G2 including one or more mass-flow controllers, valves, gas sources and others. A leading electrode system 52 is arranged in an ion leading opening of the excited particle producing chamber 51, and is connected to a power source and others (not shown) for leading ions i therefrom. A thermoelectron (thermion) discharging filament F, which is connected to the power source (not shown), is arranged inside the excited particle producing chamber 51, and a magnet group Mg for forming a cusp magnetic field is arranged along the outer surface of the chamber 51.

For forming a crystalline silicon base semiconductor thin film on a substrate S made of, e.g., glass (although not restricted thereto), the substrate S is arranged on the holder 2. The pressure in the chamber 1 is reduced to a predetermined pressure by the exhaust device 6, and the substrate S is heated by the heater 3 until the surface thereof attains a predetermined temperature not exceeding 550° C.

Thereafter, the gas supply device G1 supplies a film material gas consisting of a silicon base gas as well as an impurity gas, which is required for formation of the silicon semiconductor, into the chamber 1.

For forming the p-type silicon semiconductor, a p-type impurity gas such (e.g., a boron base gas such as a diborane gas) is used as the foregoing impurity gas. For forming the n-type silicon semiconductor, an n-type impurity gas (e.g., a phosphorus base gas such as a phosphine gas) is used as the foregoing impurity gas.

The mixing ratio between the silicon base gas and the impurity gas is controlled by the mass-flow controllers described above. The mixing ratio of the impurity gas with respect to the silicon base gas is adjusted in advance so that an appropriate impurity concentration may be achieved depending on the kind of the intended device to be produced. More specifically, this mixing ratio is adjusted to achieve the impurity gas molecules of $5 \times 10^{15}$ pcs/cm² in number at the most.

These film material gases are mixed in the chamber 1, but may be supplied into the chamber 1 after being supplied into and mixed together in an independent mixing chamber.

A film deposition pressure is kept in the chamber 1, and the power source PW applies a high-frequency voltage to the discharging electrode 4. Thereby, plasma P of the material gas is formed near the substrate S, and the silicon thin film containing the impurity is deposited on the substrate S. Further, the excited energy particles are emitted to the substrate S simultaneously with formation of the silicon thin film containing impurity, or alternately to deposition of the film.

In this embodiment, the ions i produced by the ion source 5 are used as the energy particles, and are emitted to the substrate S.

For producing the ions i by the ion source 5, the excited particle material gas formed of, e.g., at least one of a silicon base gas, which is the same as the silicon base gas supplied into the chamber 1, a hydrogen gas and an inert gas is supplied from the gas supply device G2 into the excited particle producing chamber 51, of which pressure is reduced to a predetermined value in accordance with reduction in pressure in the chamber 1. Also, thermions are emitted from the filament F to produce the ions confined within the magnetic field of the magnet group Mg. The ions i thus produced are led by the leading electrode system 52, and are emitted to the substrate S.

In this manner, the crystalline silicon base semiconductor thin film of a good quality can be formed on the substrate S at a relatively low temperature.

In the operation of emitting the ions i to the substrate S, the motion energy of the excited particles (ions in this embodiment) reaching the substrate is determined to be substantially within a range from 10 eV to 20 keV, and preferably in a range from 100 eV to 10 keV. The excited particles reaching the substrate S collide with silicon atoms in the impurity-contained silicon thin film owing to the migration effect on the substrate S so that a highly excited state is achieved, and the crystalline silicon base semiconductor thin film containing the impurity and having a good quality is formed.

Since the substrate S is kept at a temperature not exceeding 550° C. when forming the crystalline silicon base semiconductor thin film, this can prevent the impurity in the impurity diffusion layer from being diffused or locally deposited in a position other than the intended position during film deposition.

According to the example described above, the plasma of the film material gas is formed by the high-frequency discharging performed by the discharging electrode. However, the manner of forming the plasma of the film material gas is not restricted to this, and microwave discharging, ECR discharging and others may be employed. The discharging electrode may have a form other than the foregoing cylindrical form. The electrode may have a ring-like form or another form provided that the emission of the excited particles to the substrate S can be performed without difficulty.

In the example described above, the bucket type ion source is used as the ion source. However, ion sources of other types such as a Kaufman type may be used. The excited particle generating source may be formed of a device which excites the excited particle material gas by DC discharging, AC discharging, microwave discharging, ECR discharging or the like.

If the excited particle generating source is of the bucket type, the Kaufman type or the like having the magnetic field type exciting portion, the excited particle material gas can be ionized by applying the discharging power to the magnetic field type exciting portion, and the ions thus produced can be electrically accelerated by the leading electrode system for using the ions. The emission amount (in other words, the number) is appropriately determined to cause the crystallization. As already described, this amount is substantially in a range from 0.1% to 50% of the amount (or number) of the silicon atoms deposited on the substrate S, and more preferably in a range from 5% to 30%.

In the above embodiment, the film material gas contains the p- or n-type impurity gas. Alternatively, the film material gas may be formed of a silicon base gas or a mixture of the silicon base gas and a dilution gas such as a hydrogen gas, and the excited particle material gas may be formed of a gas containing the impurity gas. In this case, the excited particle material gas may be formed of only the impurity gas.

In the case where the excited particle material gas is formed of a gas containing the impurity gas, the excited particles may be produced from the excited particle material gas containing the p- or n-type impurity gas, and the crystalline silicon base semiconductor thin film may be formed by emitting the excited particles thus produced to the silicon film which is deposited on the substrate from the plasma of the film material gas. The motion energy of the impurity excited particles reaching the substrate S is controlled to be in a range from 10 eV to 20 keV at the most, and the emission amounts thereof are controlled to take on the appropriate values for providing the p- or n-type silicon semiconductor. When the ion source described above is used for the emission, the emission amount can be determined by controlling the discharging power which is supplied to the magnetic field type exciting portion for highly exciting the impurity gas, or can be determined by controlling the emission current.

According to the manufacturing of the crystalline silicon base semiconductor thin film described above, it is possible to provide the silicon base semiconductor thin film having a uniform concentration of the impurity in the film thickness direction and a good crystallinity. In particular, according to the method described above, the crystalline silicon base semiconductor thin film can be manufactured by the one film forming device in contrast to the conventional method employing the three steps, and therefore the crystalline silicon base semiconductor thin film can be manufactured at a low cost with a small energy, resulting in an extremely large economic advantage.

According to the manufacturing of the crystalline silicon base semiconductor thin film described above, the impurity is present in a uniform concentration in the direction of the thickness of the thin film. However, the state of distribution (particularly, the positions and concentration of the distributed impurity) of the impurity can be controlled in the film thickness direction.

More specifically, for mixing the impurity gas into the film material gas or the excited particle material gas, the impurity gas may be supplied after the silicon thin film deposited on the substrate S reaches a predetermined thickness, and thereby the film deposition may be subsequently performed so that the layer containing the p- or n-type impurity is formed in the predetermined portion in the film thickness direction. According to this manner, the active layer containing the impurity can be formed of, e.g., an extremely shallow layer. In this case, the amount of the supplied impurity gas can be controlled to be a predetermined value so that the impurity concentration can be controlled. In this manner, it is possible to form the extremely shallow layer having an extremely high concentration, which cannot be formed without difficulty in the prior art.

For example, the above advantage can be achieved also by emitting the excited particles produced from the impurity gas after the silicon thin film deposited on the substrate S reaches the predetermined thickness. For example, in the process of depositing the silicon thin film on the substrate S in the plasma of the silicon base material gas, one of, e.g., the silicon base material gas, hydrogen gas and inert gas, or a mixture of two or more of them may be used as the excited particle material gas, and this gas is excited and the excited particles are emitted onto the substrate for promoting the crystallization. Thereafter, the impurity gas is mixed with the excited particle material gas after the thickness of the silicon thin film reaches the predetermined value, and these mixed gases are excited and the excited particles produced from the mixed gases are simultaneously emitted so that the deposition of the film is subsequently performed. The mixing ratio of the impurity gas is controlled to be equal to a predetermined value, whereby the impurity diffusion layer having a predetermined impurity concentration can be formed in the predetermined position in the film thickness direction, similarly to the foregoing case.

According to the manufacturing of the crystalline silicon base semiconductor thin film described above, the crystalline silicon base semiconductor thin film is formed directly on the substrate S. Depending on the intended device structure, the crystalline silicon base semiconductor thin film as well as the oxide thin film (e.g., silicon oxide film ($SiO_2$ film)), which can be used, e.g., as an insulating film for a gate, and/or a metal thin film (e.g., a thin film made of aluminum, chrome or nickel), which can be used as a gate electrode, can be continuously layered on the substrate S under the predetermined gas pressures, respectively. Thereby, it is also possible to provide the crystalline silicon base semiconductor thin film additionally including the oxide thin film and/or the metal thin film.

Figure 2:
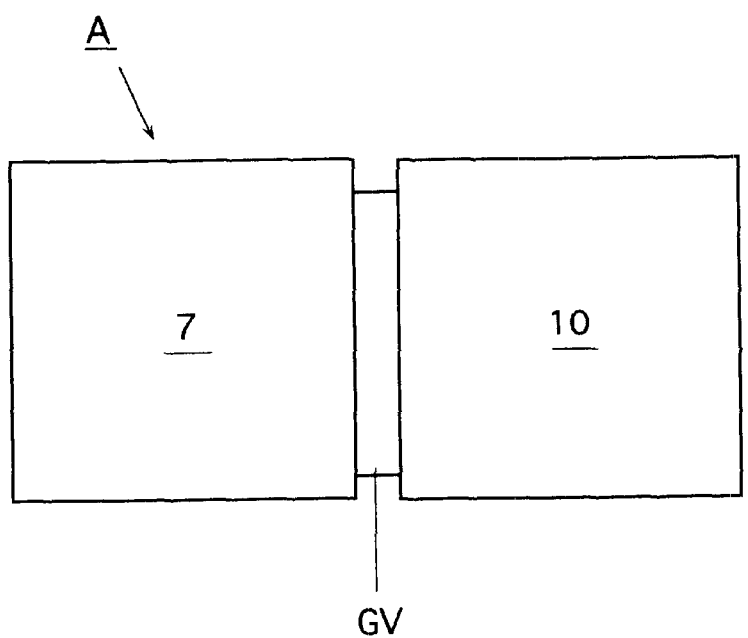
FIG. 2 shows an example of a schematic structure of a film forming device used for forming an oxide thin film and/or a metal thin film as well as a crystalline silicon base semiconductor thin film in a layered fashion.

In this case, a film forming device A shown, e.g., in FIG. 2 can be employed. In the device A, the film forming device 7 for forming the oxide thin film and/or the metal thin film is connected to the film forming device 10 for forming the crystalline silicon base semiconductor thin film shown in FIG. 1 via a gate valve GV, and this gate valve GV can be opened so that the substrate is transported between these devices by the substrate transporting device (not shown) without being exposing to the atmosphere. This device A can provide the crystalline silicon base semiconductor thin film of a good quality, in which no or only a minimum amount of impurity is externally applied to the boundary between the oxide or metal thin film and the crystalline silicon base semiconductor thin film layered thereto.

For forming the oxide thin film on the substrate S or on the crystalline silicon base semiconductor thin film formed on the substrate S, the film forming device 7 may be used as the oxide film forming device, in which case the oxide film forming means may be formed of a vapor phase composition device such as a low pressure CVD device or a plasma CVD device, although not restricted thereto. For forming the metal thin film on the substrate S or on the crystalline silicon base semiconductor thin film formed on the substrate S, the film forming device 7 may be used as the metal film forming device, in which case the metal film forming means may be formed of a vapor phase composition device such as a low pressure CVD device, and also may be formed of a device utilizing a solid phase growth method such as sputtering or electron beam vapor deposition, although not restricted thereto.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a crystalline silicon base semiconductor thin film on a substrate, comprising the steps of:

forming a thin film primarily made of silicon on said substrate by forming plasma of a film material gas containing at least a silicon base gas at the vicinity of said substrate; and crystallizing the silicon in said thin film primarily made of the silicon by emitting excited particles produced from an excited particle material gas to said substrate, wherein at least one of said film material gas and said excited particle material gas contains an impurity gas for forming the silicon semiconductor, and thereby the crystalline silicon base semiconductor thin film is formed on said substrate.

2. The method of manufacturing the crystalline silicon base semiconductor thin film according to claim 1, wherein said impurity gas is contained in said film material gas, and a silicon thin film containing the impurity is formed as said thin film primarily made of the silicon in said step of forming said thin film primarily made of the silicon.

3. The method of manufacturing the crystalline silicon base semiconductor thin film according to claim 1, wherein said impurity gas is contained in said excited particle material gas, and a silicon thin film is formed as said thin film primarily made of the silicon in said step of forming said thin film primarily made of the silicon.

4. The method of manufacturing the crystalline silicon base semiconductor thin film according to claim 3, wherein said excited particle material gas is said impurity gas.

5. The method of manufacturing the crystalline silicon base semiconductor thin film according to claim 2, wherein the amount of the impurity gas in said film material gas is controlled to take on a value in a time band during formation of said thin film primarily made of silicon so as to control the state of distribution of said impurity in the film thickness direction of the crystalline silicon base semiconductor thin film.

6. The method of manufacturing the crystalline silicon base semiconductor thin film according to claim 3, wherein the amount of the impurity gas in said excited particle material gas is controlled to take on a value within a time band during formation of said thin film primarily made of silicon so as to control the state of distribution of said impurity in the film thickness direction of the crystalline silicon base semiconductor thin film.

7. The method of manufacturing the crystalline silicon base semiconductor thin film according to claim 3, wherein excited particles produced from said excited particle material gas are emitted to said substrate within a time band during formation of said thin film primarily made of silicon so as to control the state of distribution of said impurity in the film thickness direction of the crystalline silicon base semiconductor thin film.

8. The method of manufacturing the crystalline silicon base semiconductor thin film according to any one of the preceding claims 1 to 7, wherein said impurity gas is a gas for obtaining a p-type silicon semiconductor or an n-type silicon semiconductor.

9. The method of manufacturing the crystalline silicon base semiconductor thin film according to any one of the preceding claims 1 to 7, wherein a motion energy of said excited particles emitted for formation of the crystalline silicon base semiconductor thin film is in a range from 10 eV to 20 keV.

10. The method of manufacturing the crystalline silicon base semiconductor thin film according to any one of the preceding claims 1 to 7, wherein the amount of said excited particles emitted for formation of the crystalline silicon base semiconductor thin film is in a range from 0.1% to 50% of the amount of the silicon atoms deposited on said substrate.

11. The method of manufacturing the crystalline silicon base semiconductor thin film according to any one of the preceding claims 1 to 7, wherein said substrate is kept at a temperature not exceeding 550° C. during formation of the crystalline silicon base semiconductor thin film.

12. A method of manufacturing a crystalline silicon base semiconductor thin film, wherein an oxide thin film is formed on said substrate prior to formation of said thin film primarily made of silicon, the crystalline silicon base semiconductor thin film is formed on said oxide thin film by the method according to any one of the preceding claims 1 to 7, and said oxide thin film and said crystalline silicon base semiconductor thin film are successively formed under gas pressures, respectively.

13. A method of manufacturing a crystalline silicon base semiconductor thin film, wherein a metal thin film is formed on said substrate prior to formation of said thin film primarily made of silicon, the crystalline silicon base semiconductor thin film is formed on said metal thin film by the method according to any one of the preceding claims 1 to 7, and said metal thin film and said crystalline silicon base semiconductor thin film are successively formed under gas pressures, respectively.

14. A method of manufacturing a crystalline silicon base semiconductor thin film, wherein the crystalline silicon base semiconductor thin film is formed on a substrate by the method according to any one of the preceding claims 1 to 7, an oxide thin film or a metal thin film is subsequently formed on said semiconductor thin film, and said semiconductor thin film as well as said oxide or metal thin film are successively formed under gas pressures, respectively.

15. The method of manufacturing the crystalline silicon base semiconductor thin film according to claim 1, wherein said emission of the excited particles is performed simultaneously with formation of the thin film primarily made of silicon.

16. The method of manufacturing the crystalline silicon base semiconductor thin film according to claim 1, wherein said emission of the excited particles and said formation of the thin film primarily made of silicon are performed alternately to each other.

* * * * *

UNITED STATES PATENT AND TRADEMARK OFFICE
CERTIFICATE OF CORRECTION

PATENT NO. : 6,358,313 B1
DATED : March 19, 2002
INVENTOR(S) : Shuhei Tsuchimoto et al.

It is certified that error appears in the above-identified patent and that said Letters Patent is hereby corrected as shown below:

<u>Column 11,</u>
Lines 16-32, delete
"A method of manufacturing a crystalline silicon base semiconductor thin film on a substrate, comprising the steps of:
    forming a thin film primarily made of silicon on said substrate by forming plasma of a film material gas containing at least a silicon base gas at the vicinity of said substrate; and
    crystallizing the silicon in said thin film primarily made of the silicon by emitting excited particles produced from an excited particle material gas to said substrate, wherein
    at least one of said film material gas and said excited particle material gas contains an impurity gas for forming the silicon semiconductor, and thereby the crystalline silicon base semiconductor thin film is formed on said substrate."

and substitute with

-- 1. A method of manufacturing a crystalline silicon base semiconductor thin film on a substrate, comprising the steps of:
    forming a thin film primarily made of silicon on said substrate by forming plasma of a film material gas containing at least a silicon base gas at the vicinity of said substrate; and
    crystallizing the silicon in said thin film primarily made of the silicon by emitting excited particles produced from an excited particle material gas to said substrate, wherein
    the emission of the excited particles is performed either one of simultaneously and alternately with the formation of the thin film primarily made of silicon, and wherein
    at least one of said film material gas and said excited particle material gas contains an impurity gas for forming the silicon semiconductor, and thereby the crystalline silicon base semiconductor thin flim is formed on said substrate. --

UNITED STATES PATENT AND TRADEMARK OFFICE
CERTIFICATE OF CORRECTION

PATENT NO. : 6,358,313 B1
DATED : March 19, 2002
INVENTOR(S) : Shuhei Tsuchimoto et al.

It is certified that error appears in the above-identified patent and that said Letters Patent is hereby corrected as shown below:

<u>Column 12,</u>
Lines 56-65, delete
"15. The method of manufacturing the crystalline silicon base semiconductor thin film according to claim 1, wherein said emission of the excited particles is performed simultaneously with formation of the thin film primarily made of silicon.
16. The method of manufacturing the crystalline silicon base semiconductor thin film according to claim 1, wherein said emission of the excited particles and said formation of the thin film primarily made of silicon are performed alternately to each other."

Signed and Sealed this

Nineteenth Day of November, 2002

Attest:

Attesting Officer

JAMES E. ROGAN
*Director of the United States Patent and Trademark Office*